United States Patent
Wu et al.

[11] Patent Number: 6,140,909
[45] Date of Patent: Oct. 31, 2000

[54] HEAT-GENERATING RESISTOR AND USE THEREOF

[75] Inventors: Yi-Yung Wu, Taichung; Dong-Sing Wuu, Changhua; Chia-Chi Chan, Changhua; Ray-Hua Horng, Changhua, all of Taiwan

[73] Assignee: Industrial Technology Research Institute, Taiwan

[21] Appl. No.: 09/354,391

[22] Filed: Jul. 14, 1999

[30] Foreign Application Priority Data

Mar. 23, 1999 [TW] Taiwan ................... 88104548

[51] Int. Cl.$^7$ .................................. H01C 1/012
[52] U.S. Cl. ................ 338/308; 347/62; 252/521.1
[58] Field of Search ............................. 338/306, 307, 338/308, 309; 252/518.1, 521.1; 347/62

[56] References Cited

U.S. PATENT DOCUMENTS

| | | | |
|---|---|---|---|
| 3,955,039 | 5/1976 | Roschy et al. | 338/308 |
| 4,396,900 | 8/1983 | Hall | 338/309 |
| 4,723,129 | 2/1988 | Endo et al. . | |
| 4,740,796 | 4/1988 | Endo et al. . | |
| 4,946,082 | 8/1990 | Brun et al. | 222/593 |
| 5,142,308 | 8/1992 | Hasegawa et al. . | |
| 5,148,191 | 9/1992 | Hasegawa et al. | 338/308 |
| 5,154,883 | 10/1992 | Fleischer | 420/427 |
| 5,477,252 | 12/1995 | Hasegawa et al. | 338/308 |
| 5,538,528 | 7/1996 | Kashiwagi et al. | 65/275.1 |
| 6,010,584 | 1/2000 | Fonda et al. | 420/427 |

*Primary Examiner*—Karl D. Easthom
*Attorney, Agent, or Firm*—Beyer Weaver & Thomas, LLP

[57] ABSTRACT

A heat-generating resistor comprised essentially of Ru and Ta at the following composition ratios:

22 atom percent $\leq$Ru$\leq$66 atom percent and 34 atom percent $\leq$Ta$\leq$78 atom percent, and an ink jet head which includes said heat-generating resistor are provided.

11 Claims, 1 Drawing Sheet

HEAT-GENERATING RESISTOR AND USE THEREOF

BACKGROUND OF THE INVENTION

1. Field of the Invention

The present invention relates to a heat-generating resistor. More particularly, it relates to a heat-generating resistor for an ink jet head, such as a bubble ink jet head.

2. Description of the Related Arts

Recently, various types of ink jet heads have been developed for projecting ink from a discharging opening and attaching the ink onto a recording medium such as paper, etc. Among them, a bubble ink jet head which discharges ink from an orifice by utilizing heat energy as disclosed in U.S. Pat. No. 4,723,129 and 4,740,796 has advantages such as good response to recording signal and easy formation of multiple projecting openings.

The principal structure of a bubble ink jet head utilizing heat energy as the ink discharging energy is shown in FIG. 1.

In general, a silicon substrate 10 is provided and an insulating layer 12, such as a phosphosilicate glass layer or silicon oxide layer, is formed thereon. A heat-generating resistor 14 located above the insulating layer 12, a protective layer 18 provided on the heat-generating resistor 14, a pair of electrodes 16 positioned below an ink path 20, and an orifice plate 22 are also included.

In this bubble ink jet head, the energy for ink discharge is imparted by the electrothermal transducer having a pair of electrodes 16 and a heat-generating resistor 14 connected electrically to the electrodes 16. That is, when current caused by a pulse voltage is applied on the electrodes 16 to generate heat from the heat-generating resistor 16, the ink in the ink path 20 near the bubble generating region 19 is momentarily heated. When the ink is heated to higher than its boiling point, bubbles of ink are generated at the bubble generating region 19, which cause a discharge pressure due to momentary volume expansion and shrinkage. Finally, drops are projected from an orifice due to the discharge pressure.

During operation, the heat-generating resistor is subjected to a mechanical shock caused by repetitions of the production and extinction of bubbles of ink, and is subjected to a rise or a drop of temperature over 300° C. for a very short period of the time on the order of 1 to 10 microseconds; therefore, the material of the heat-generating resistor must have good durability and stability.

Consequently, various metals, alloys, metallic compounds or cermets beginning with TaN and $RuO_2$ which are conventionally known as materials of heat generating resistors are not always satisfactory in durability or stability for application to a heat-generating resistor.

Other materials for a heat-generating resistor, such as $HfB_2$ or TaAl, are patterned with a reactive ion etching method using chlorine-based gas such as $Cl_2$ or $BCl_3$, and therefore have the problems of high cost and danger in production.

SUMMARY OF THE INVENTION

In view of the disadvantages of the materials mentioned above, the principle object of the invention is to provide a heat-generating resistor essentially comprising Ru and Ta for the fabrication an ink jet head. The heat-generating resistor can be a Ta—Ru alloy layer and a composite layer comprising alternatively a pure Ru sublayer and a pure Ta sublayer. Harmful chloride-base gas need not be used as etching gas, allowing safety in production. The Ta—Ru alloy has a high melting point, and furthermore, the heat-generating resistor is superior in mechanical durability and thermal shock resistance.

According to an aspect of the present invention, there is provided a heat-generating resistor comprised essentially of Ru and Ta at the following composition ratios:

22 atom percent $\leq Ru \leq 66$ atom percent 34 atom percent $\leq Ta \leq 78$ atom percent; and According to another aspect of the invention, there is provided an ink jet head which includes a heat-generating resistor comprised essentially of Ru and Ta at the following composition ratios:

22 atom percent $\leq Ru \leq 66$ atom percent 34 atom percent $\leq Ta \leq 78$ atom percent; and Other objects, features, and advantages of the present invention will become apparent from the following detailed description which makes reference to the accompanying drawings.

DETAILED DESCRIPTION OF THE INVENTION

Figure 1:
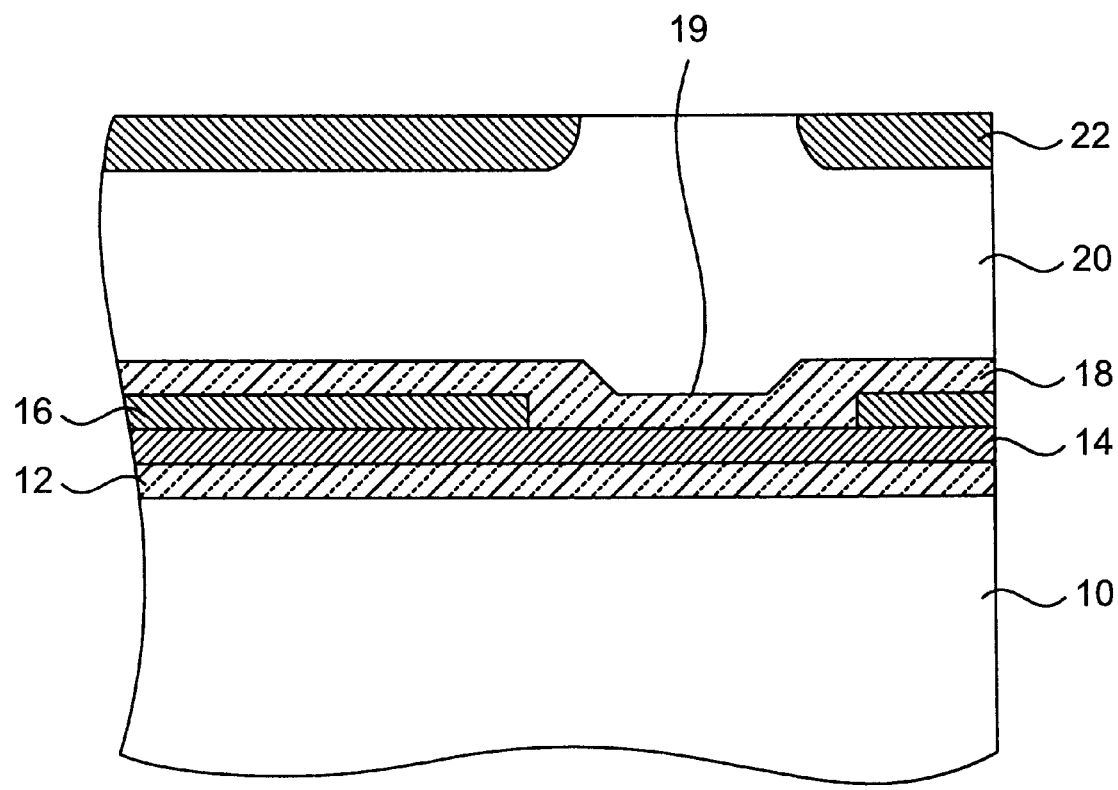
FIG. 1 is a schematic sectional view illustrating the base member for an ink jet head.

The heat-generating resistor comprising Ta—Ru substances described above is normally formed as a single layer structure. It may also be in the form of a multi-layer structure, in some cases.

Further, the thickness of the layer of the heat-generating resistor preferably ranges from 500–5000 angstroms to achieve durability, adequate production characteristics, and so forth.

In addition, a heat-generating resistor according to the present invention can be formed physically, for example by a DC-sputtering method, wherein individual material are piled up simultaneously or alternatively, an RF-sputtering method or an ion-beam sputtering method, or chemically, for example by a chemical vapor deposition (CVD) method.

From the above detailed description, it is understood that the heat-generating resistor comprising essentially Ru and Ta according to the invention has the advantages as follows: (1) no harmful chloride-base gas is used as etching gas for patterning the heat-generating resistor and (2) the melting point of the Ta—Ru alloy is much higher than that of the conventional Al—Ta alloy. Therefore, it is superior in mechanical durability, thermal shock resistance and safety in production, and can be applied to an ink jet head able to print $5 \times 10^8$ drops of ink.

Without intending to limit it in any manner, the present invention will be further illustrated by the following examples.

EXAMPLE 1

In this example, the heat-generating resistor comprising Ta—Ru substances is formed by using the magnetron sputtering method.

Before the sputtering procedure is performed, the base pressure of the sputtering chamber was vaccumed lower than $5 \times 10^{-7}$ torr in order to avoid the presence of the residue of oxygen gas and moisture which will produce oxygen atoms to react with the depositing metal to form metal-oxide when the plasma is formed in the sputtering chamber.

A Si single crystalline substrate of 4 inch size having a SiO$_2$ film of 0.25 μm thickness formed thereon was set as the sputtering substrate and discs of Ru and Ta, each 4 inches in size and having a purity higher than 99.9 weight percent were set as targets. The two kinds of metal were sputtered simultaneously to form an alloy layer using a magnetron sputtering method. The conditions of the sputtering are shown in the following Table 1. Analysis of the properties of the film, such as composition, thickness, crystalline structure and specific structure, are also shown in Table 1.

Subsequently, an electrode layer comprising Al was formed on the Ta—Ru film by sputtering.

After then, the Ta—Ru film and the Al layer were patterned to form the heat-generating resistor and the electrode connected to the heat-generating resistor in the shapes shown in FIG. 1.

The heat-generating resistor was patterned, using photolithography technique and reactive ion etching in the following conditions:

| | |
|---|---|
| Reactive gas: | CF$_4$ (70 sccm), O$_2$ (10 sccm) and Ar (5 sccm) |
| RF power: | 300 W |
| Substrate temperature: | 60° C. |
| Etch rate: | 200 Å/min |

Finally, other elements, such as protective layers, ink paths and an orifice plate are successively formed to obtain an ink jet head which can print 5×10$^8$ drops of ink.

EXAMPLE 2 To 6

Heat-generating resistors were produced in a similar manner as in Example 1 except that the applied power to the Ru target was changed variously as shown in Table 1.

While the invention has been particularly shown and described with reference to the preferred embodiment thereof, it will be understood by those skilled in the art that various changes in form and details may be made without departing from the spirit and scope of the invention.

TABLE 1

| Example No. | Applied power (W) Ta | Applied power (W) Ru | Film composition (atomic %) Ta | Film composition (atomic %) Ru | Film thickness (Å) | Crystallinity | Specific resistance (μΩ-cm) |
|---|---|---|---|---|---|---|---|
| 1 | 300 | 50 | 78 | 22 | 1500 | poly | 261 |
| 2 | 300 | 100 | 65 | 35 | 1800 | poly | 293 |
| 3 | 300 | 150 | 54 | 46 | 1700 | poly | 339 |
| 4 | 300 | 200 | 46 | 54 | 1900 | poly | 265 |
| 5 | 300 | 250 | 39 | 61 | 1600 | poly | 197 |
| 6 | 300 | 300 | 34 | 66 | 1800 | poly | 184 |

Substrate set temperature: 150° C.
Base pressure: 5 × 10$^{-7}$ torr or less
Sputtering gas and gas pressure: argon gas, 15 mtorr

What is claimed is:

1. An apparatus comprising:

an ink jet head having a heat-generating resistor formed on a substrate, the heat-generating resistor consisting of the following composition ratios:

22 atom percent $\leq$ Ru $\leq$ 66 atom percent; and 34 atom percent $\leq$ Ta $\leq$ 78 atom percent.

2. The apparatus of claim 1, wherein the heat-generating resistor is an alloy layer.

3. The apparatus of claim 1, wherein the heat-generating resistor is a composite layer comprising alternately a pure Ru sublayer and a pure Ta sublayer.

4. The apparatus of claim 1, wherein the thickness of said heat-generating resistor ranges from 500–5000 angstroms.

5. The apparatus of claim 1, wherein said heat-generating resistor is made by sputtering the Ta and Ru onto the substrate.

6. The apparatus of claim 1, wherein said heat-generating resistor is used for the fabrication of the ink jet head.

7. The ink jet head as claimed in claim 6, wherein said heat-generating resistor is an alloy layer.

8. The ink jet head as claimed in claim 6, wherein said heat-generating resistor is a composite layer comprising alternately a pure Ru layer and a pure Ta layer.

9. The ink jet head as claimed in claim 1, wherein the thickness of said heat-generating resistor ranges from 500–5000 angstroms.

10. The ink jet head as claimed in claim 1, wherein said heat-generating resistor is made by sputtering.

11. An ink jet head comprising:

a substrate;

a heat-generating resistor formed on the substrate, the heat-generating resistor consisting of Ru and Ta with the following composition ratios:

22 atom percent $\leq$ Ru $\leq$ 66 atom percent; and 34 atom percent $\leq$ Ta $\leq$ 78 atom percent; and electrodes coupled to the heat-generating resistor on the substrate.

* * * * *